US009406588B2

(12) United States Patent
Lin et al.

(10) Patent No.: US 9,406,588 B2
(45) Date of Patent: Aug. 2, 2016

(54) SEMICONDUCTOR PACKAGE AND MANUFACTURING METHOD THEREOF

(71) Applicant: TAIWAN SEMICONDUCTOR MANUFACTURING COMPANY LTD., Hsinchu (TW)

(72) Inventors: Jing-Cheng Lin, Taoyuan County (TW); Po-Hao Tsai, Taoyuan County (TW); Ying Ching Shih, Taipei (TW); Szu Wei Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 109 days.

(21) Appl. No.: 14/076,381

(22) Filed: Nov. 11, 2013

(65) Prior Publication Data

US 2015/0130070 A1 May 14, 2015

(51) Int. Cl.
*H01L 23/48* (2006.01)
*H01L 25/10* (2006.01)
*H01L 23/538* (2006.01)
*H01L 23/00* (2006.01)
(Continued)

(52) U.S. Cl.
CPC .......... *H01L 23/481* (2013.01); *H01L 21/6835* (2013.01); *H01L 23/49827* (2013.01); *H01L 23/49838* (2013.01); *H01L 23/5389* (2013.01); *H01L 24/19* (2013.01); *H01L 24/97* (2013.01); *H01L 25/105* (2013.01); *H01L 21/561* (2013.01); *H01L 21/568* (2013.01); *H01L 21/6836* (2013.01); *H01L 23/49816* (2013.01); *H01L 24/48* (2013.01); *H01L 24/73* (2013.01); *H01L 24/83* (2013.01); *H01L 24/92* (2013.01); *H01L 2221/68318* (2013.01); *H01L 2221/68327* (2013.01); *H01L 2221/68372* (2013.01); *H01L 2221/68381* (2013.01); *H01L 2224/04105* (2013.01); *H01L 2224/05569* (2013.01); *H01L 2224/05655* (2013.01); *H01L 2224/05666* (2013.01); *H01L 2224/12105* (2013.01); *H01L 2224/13111* (2013.01); *H01L 2224/32145* (2013.01); *H01L 2224/32245* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/83385* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01);
(Continued)

(58) Field of Classification Search
CPC ....... H01L 24/32; H01L 24/02; H01L 23/481; H01L 24/83; H01L 2224/023
See application file for complete search history.

(56) References Cited

U.S. PATENT DOCUMENTS 7,619,305 B2 11/2009 Fan et al.
2009/0140442 A1* 6/2009 Lin ............................. 257/778

*Primary Examiner* — David Vu
(74) *Attorney, Agent, or Firm* — Chun-Ming Shih

(57) ABSTRACT

The present disclosure provides a semiconductor structure. The semiconductor structure includes a carrier, a first redistribution layer (RDL) over the carrier, a semiconductor die over the first RDL, an adhesive layer between the semiconductor die and the first RDL, and a molding compound encapsulating the first RDL, the semiconductor die, and the adhesive layer. The first RDL includes at least one pattern electrically isolated from any component of the semiconductor structure. The present disclosure provides a method for manufacturing a semiconductor structure discussed herein. The method includes forming an RDL on a carrier, defining an active portion and a dummy portion of the RDL, and placing a semiconductor die over the dummy portion of the RDL.

19 Claims, 17 Drawing Sheets

(51) Int. Cl.
*H01L 21/683* (2006.01)
*H01L 21/56* (2006.01)
*H01L 23/498* (2006.01)

(52) U.S. Cl.
CPC ................ *H01L 2924/12042* (2013.01); *H01L 2924/15311* (2013.01); *H01L 2924/181* (2013.01); *H01L 2924/3511* (2013.01)

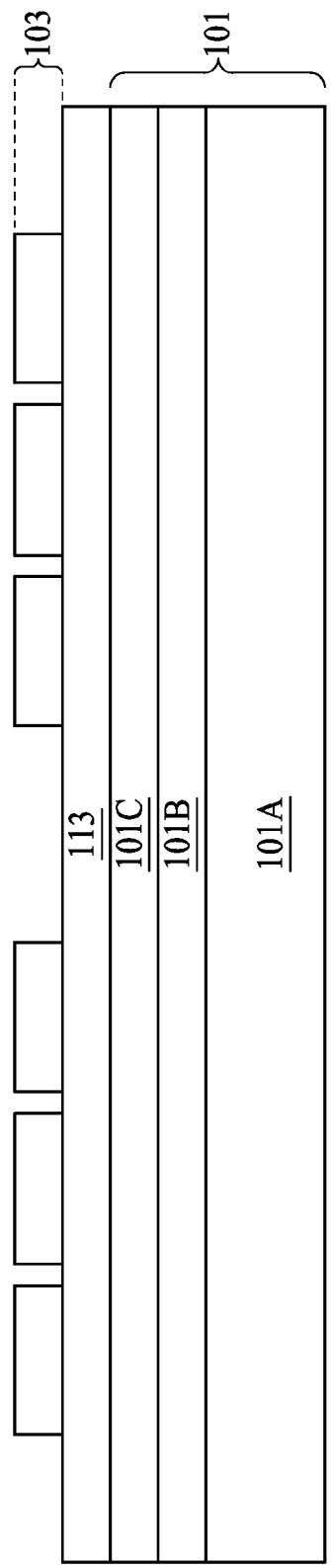

SEMICONDUCTOR PACKAGE AND MANUFACTURING METHOD THEREOF

FIELD

The present disclosure relates to a semiconductor package.

BACKGROUND

In the semiconductor industry, the fabrication of integrated circuits (IC) can be divided at least into three phases: wafer fabrication, IC fabrication process, and IC packaging. Each chip is fabricated through wafer fabrication, circuit design, photolithography and etching processes, and wafer dicing. After each chip formed based on the wafer dicing is electrically connected to external signals through a bonding pad on the chip, the chip can be encapsulated by a sealant material. The packaging process protects the chip from heat, humidity, and noises and provides an electrical connection medium between the chip and external circuits. By such means, packaging of the IC is completed.

Mobile devices such as mobile phones, mobile internet devices (MIDs) and laptops, are designed with smaller form factor and slimmer profile for improved aesthetic and functional appeals. The size of and real estate occupied by semiconductor packages in the devices need to be scaled down accordingly. Package-on-package (PoP) packaging technology is employed to stack a semiconductor package on top of another semiconductor package to remove the x and y dimensions constraints in the layout of semiconductor packages on a motherboard. PoP allows vertically combining, for example, discrete logic and memory ball grid array (BGA) packages. Two or more packages are installed on top of one another, e.g. stacked, with a standard interface to route signals between them. This allows higher density in the mobile device market.

Today's PoP semiconductor devices enjoy increasing popularity, because they promise to use components already developed and thus quickly available, they are supposed to retain a slim space-saving contour after assembly, and they are expected to be robust in terms of reliability in use-test under variable temperature and moisture conditions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 7A to FIG. 7K are a method for manufacturing a semiconductor structure according to some embodiments of the present disclosure.

DETAILED DESCRIPTION OF THE INVENTION

Figure 1:
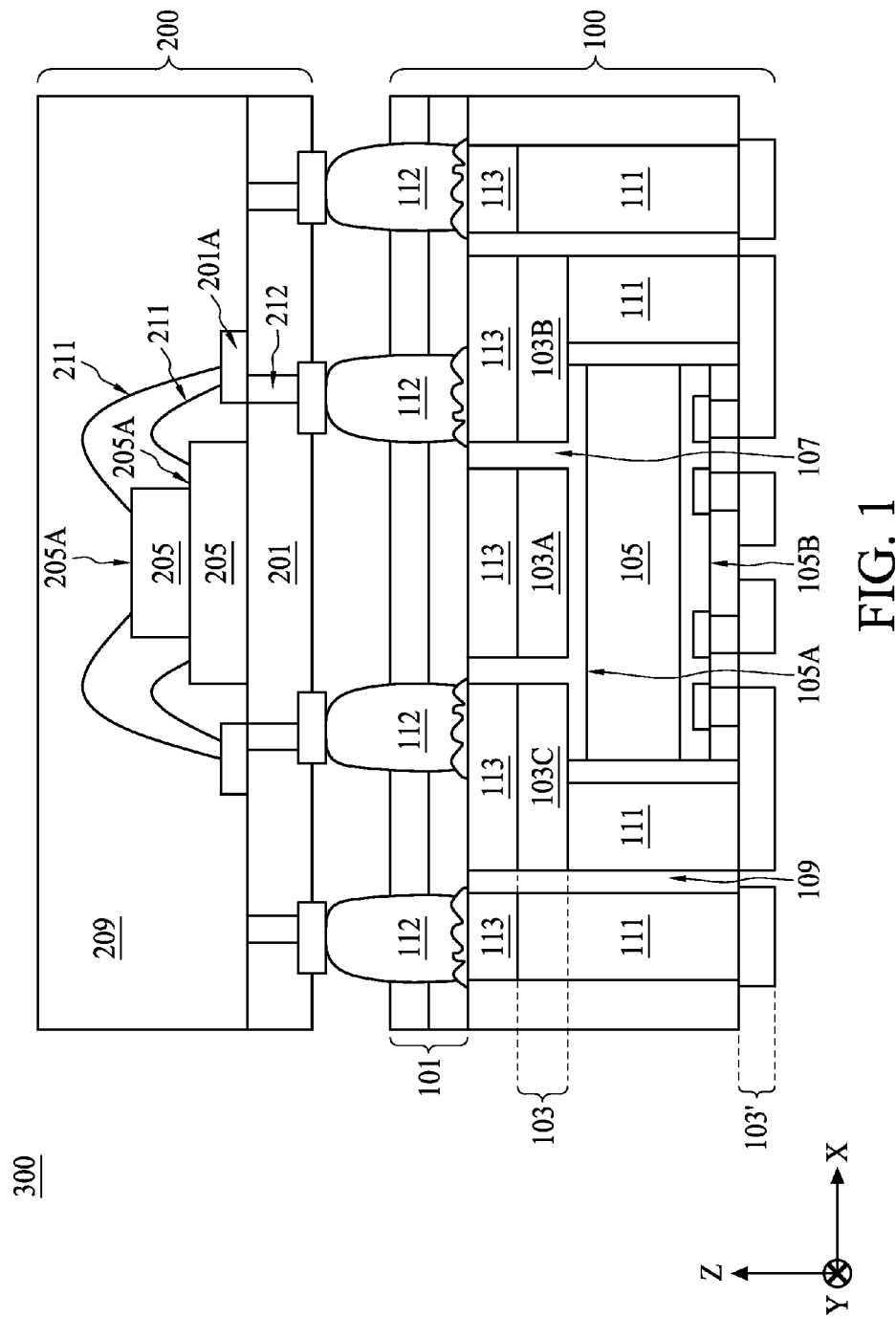
FIG. 1 is a cross sectional view of a semiconductor structure according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

In a fan-out wafer level chip scale packaging (WLCSP) technique, 3-D electrical interconnection with an interconnect I/O array through vertical interconnects formed inside a footprint of semiconductor die usually adopt a back-side RDL that extends the conduction path outside the footprint of the semiconductor die. For example, if a footprint of a DRAM package scales smaller than a footprint of a semiconductor die package positioned underneath, a back-side RDL close to the semiconductor die package is introduced to provide a receiving point of the electrical signal and routing the signal through a fan-out construction, eventually guiding the signal to a front side of the semiconductor die. In some embodiments of the present disclosure, the back-side RDL refers to an RDL formed close to a back side, instead of a front side, of a semiconductor die or a semiconductor die. The back side of a semiconductor die or a semiconductor die is opposite to a front side. The front side is where the contact pads, under bump metallization (UBM), and a front-side RDL are situated. However, the back-side RDL is not limited to a PoP semiconductor package where vertical interconnects are formed inside a footprint of semiconductor die. Vertical interconnects formed outside a footprint of semiconductor die can also utilize the back-side RDL.

When a semiconductor die is placed on a back-side RDL using a fan-out packaging technique, a die attached film (DAF) or an adhesive bonding film (ABF) is introduced between the semiconductor die and the back-side RDL to physically adhere the semiconductor die and the back-side RDL. A heating operation is followed after the semiconductor die placement, and a portion of the DAF or ABF is softened and flowing into a gap between adjacent patterns of the back-side RDL. However, the gap is not completely filled with the softened DAF or ABF, and several voids are formed in certain areas under the semiconductor die. Some voids occupy areas as large as areas with successful gap-fillings (i.e., no void).

The presence of voids creates weak spots on reliability test and causes the semiconductor die loosely attached on the back-side RDL. For example, after the die placement and the heating operation immediately followed, a molding compound is applied to encapsulate the back-side RDL and the semiconductor die. Under certain circumstances, the loosely-attached die is easily shifted from its original position because of a shear force exerted from the molding compound. Consequently, the subsequent patterns overlaid on the semiconductor die turn out to be misaligned. Even under the condition when only a minor shift is occurred, the subsequent patterns are still landing on positions that are out of specifications. The generation of voids between the semiconductor die and the back-side RDL deteriorate the overall reliability of the semiconductor package.

In some cases when the patterns of the back-side RDL are not even in terms of the pattern heights, the semiconductor die is tilted after the placement. For example, after the die placement and the heating operation immediately followed, a molding compound is applied to encapsulate the back-side RDL and the semiconductor die. A planarization operation (for example, a chemical mechanical polishing operation) is subsequently followed to expose a front side of the semiconductor die. Because the semiconductor die is tilted after the placement and hence the total thickness variation of the semiconductor die is increased, the planarization operation induces an over-grinding of the semiconductor die at a more elevated end of the tilted surface, damaging the contact pads, conductive plug, and under bump metallization (UBM) formed on the front side of the semiconductor die.

Various means were implemented to solve the above-mentioned problems between the semiconductor die and the back-side RDL. For example, when heating up the sample after the semiconductor die placement, extended heating duration (or increasing time for bonding) is applied to allow a more complete softening of the DAF or ABF, and hence a more integrated gap-filling. However, increasing the heating duration (or time for bonding) decreases the throughput of the semiconductor die pick and placement. For instance, the manufacturing cost is increased more than 5 times compared to a cost when a normal heating duration is used. In another example, a force exerted on the semiconductor die is increased in order to enhance the adhesion between the semiconductor die and the back-side RDL. Observation shows the voids under the semiconductor die cannot be removed either by prolonging the heating duration or by applying additional forces on the semiconductor die.

The present disclosure provides a back-side RDL structure which includes at least a dummy portion. In some embodiments, the dummy portion is designed to be as a same height as an active portion of the back-side RDL. In certain embodiments, the dummy portion of the back-side RDL is primarily used to resolve the incomplete gap-filling problem and the tilted semiconductor die as discussed above.

In some embodiments, a portion of the dummy portion of the RDL is positioned outside a footprint of the semiconductor die. In other embodiments, a footprint of the semiconductor die is greater than a footprint of the dummy portion of the RDL.

Compared to the package where only active portion is devised in the back-side RDL, an area ratio of the footprint of the dummy portion and the semiconductor die is less is than 1.2.

In describing and claiming the present disclosure, the following terminology will be used in accordance with the definitions set forth below.

As used herein, an "active portion" refers to a position on a pattern which performs the actual computing and storage operations of the semiconductor die. In some embodiments, an active portion of a redistribution layer (RDL) directs to some patterns of the RDL that are connected to a through package via (TPV). In other embodiments, an active portion of an RDL directs to some patterns of the RDL that are connected to a TPV at a first side of the RDL and are connected to a conductive plug at a second side opposite to the first side of the RDL.

As used herein, a "dummy portion" refers to a position which does not form any electrical conductive path connected to the physical part of a package that contains the transistors, resistors, and capacitors. In some embodiments, the dummy portion is not limited to specific regions within a semiconductor package because whether the position forming an electrical conductive path connected to the active structure depends on the electrical routing design in individual packaging structure.

As used herein, "vapor deposition" refers to process of depositing materials on a substrate using a vapor phase of a material to be deposited or a precursor of the material. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As used herein, "molding compound" refers to a compound formed with composite materials. A molding compound may include epoxy resins, phenolic hardeners, silicas, catalysts, pigments, mold release agents, or the like. Material for forming a molding compound has a high thermal conductivity, a low moisture absorption rate, a high flexural strength at board-mounting temperatures, or a combination thereof.

As used herein, "electrical interconnects" refers to conductive lines or films routed inside the IC structure over and around the die or dies. In some embodiments, the electrical interconnects are redistribution layers (RDL). The RDLs are used for a fan-in or a fan-out process. In some embodiments, the electrical interconnects are formed with a conductive material such as gold, silver, copper, nickel, tungsten, aluminum, and/or alloys thereof.

As used herein, a "through package via (TPV)" refers to a conductive filled via or a conductive plug that is disposed on a carrier, a substrate, or embedded in a molding compound. The conductive filled via or a conductive plug is arranged to extend to a top surface of the package or the molding compound. Conductive posts may provide an electrical communication between a top surface and a bottom surface of the package or provide an electrical communication between a top surface of the package to a chip in the package.

As used herein, a "contact pad" is disposed on a top surface of a die. A top surface of the contact pad may receive a solder ball or solder paste and acts as a terminal to connect the die to an external circuit or electrically connects to an RDL. A bottom surface of the contact pad is either connected to an interconnect, such as an RDL, or to an active area in the die. In some embodiments, the contact pad is an under bump metallization (UBM). In some embodiments, the UBM is formed with a conductive material such as gold, silver, copper, nickel, tungsten, aluminum, and/or alloys thereof.

As used herein, a "patterning" or "patterned" is used in the present disclosure to describe an operation of forming a predetermined pattern on a surface. The patterning operation includes various steps and processes and varies in accordance with features of embodiments. In some embodiments, a patterning operation patterns an existing film or layer. The patterning operation includes forming a mask on the existing film or layer and removing the unmasked portion of the film or layer with an etch or other removal process. The mask is a photo resist or a hardmask. In some embodiments, a patterning operation directly forms a patterned layer on a surface. The patterning operation includes forming a photosensitive film on the surface, conducting a photolithography process and a developing process. The remaining photosensitive film may be removed or retained and integrated into the package.

As used herein, "plating" or "plated" is used in the present disclosure to describe an operation of forming a film or a layer on a surface. The plating operation includes various steps and processes and varies in accordance with features of embodiments. The film or layer plated on the surface may be a single film or a composite stack. In some embodiments, a plating operation forms a metallic film. In some embodiments, a plating operation includes forming a seed layer and electroplating a metallic film on the seed layer.

As used herein, "filling" or "filled" is used in the present disclosure to describe an operation of forming material in a hole. The filling operation includes various steps and processes and varies in accordance with features of embodiments. In some embodiments, a filling operation includes forming a conductive material in a hole. In some embodiments, a filling operation includes forming a liner on the sidewalls of the hole and forming a conductive film on the liner. In some embodiments, a filling operation includes an electroplating process. In some embodiments, a filling operation includes a vapor deposition process. In some embodiments, a filling operation includes a sputtering process.

Referring to FIG. 1, a semiconductor structure 300 including two packages are shown in a cross sectional view. The cross section of the semiconductor structure 300 is an X-Z plane according to the Cartesian coordinate system labeled in FIG. 1. A positive Y direction is pointing into the paper, and a negative Y direction is pointing toward the reader. A semiconductor package 100 is electrically connected to a semiconductor package 200 through several conductive plugs 112. In some embodiments, the semiconductor structure 300 is a package-on-package (PoP) structure. In certain embodiments, the semiconductor packages 100 and 200 include a microprocessor package, a memory package (including a dynamic random access memory or a flash memory), application specific integrated circuits (ASIC), logic circuits, analog circuits, radio frequency (RF) circuits, discrete devices, or other semiconductor die or electrical components. In certain embodiments, the semiconductor structure 300 is part of a cellular phone, personal digital assistant (PDA), digital video camera (DVC), or other electronic communication device. Alternatively, the semiconductor structure 300 is a graphics card, network interface card, or other signal processing card that can be inserted into a computer.

Referring to semiconductor package 100 in FIG. 1, the semiconductor package 100 includes a carrier 101 having a front surface and a back surface opposite to the front surface. The front surface of the carrier 101 refers to the surface in proximity to a semiconductor die 105. In some embodiments, the carrier 101 has several layers including, but not limited to, a solder resist layer, a laminating compound layer, and an adhesive bonding film. A patterned seed layer 113 is attached to the front surface of the carrier 101. In some embodiments, the seed layer 113 includes multiple layers of selectively plated Ni/Au, Ti/Cu, or Ti/Cu/NiV/Cu. A first redistribution layer (103A, 103B, 103C) is in contact with a portion of the seed layer 113. A semiconductor die 105 is further attached to the first redistribution layer (103A, 103B, 103C) through an adhesive layer 107. In some embodiments, the adhesive layer 107 is a die attach film (DAF). In certain embodiments, a footprint of the semiconductor die 105 at least covers a pattern 103A of the first redistribution layer 103. In other embodiments, a footprint of the semiconductor die 105 is smaller than the pattern 103A of the first redistribution layer 103. More detailed discussion to the footprint of the semiconductor die 105 and the footprint of the pattern 103A of the first redistribution layer 103 can be referred to FIGS. 5A to 6D in the present disclosure.

In FIG. 1, two patterns 103B and 103C in the first redistribution layer 103 are electrically connected to a through package via (TPV) 111, respectively. One end of the TPV 111 is electrically coupled to the first redistribution layer (103B, 103C), and the other end of the TPV 111 is electrically coupled to a front side of the semiconductor die 105B through a second redistribution layer 103'. In certain embodiments, the semiconductor die 105 includes a front side 105B and a back side 105A. The back side 105A of the semiconductor die 105 is attached to the first redistribution layer 103 through an adhesive layer 107, and the front side 105B of the semiconductor die 105 includes electrical connections to devices or semiconductor structures outside of the semiconductor package 100. The electrical connection on the front side 105B includes, but no limited to, contact pads, under bump metallization, and metal bumps.

In FIG. 1, at least one pattern 103A in the first redistribution layer is electrically isolated from any component of the semiconductor package 100. Compared to the two patterns 103B and 103C in the first redistribution layer 103, the at least one pattern 103A is surrounded and covered by the adhesive layer 107. In some embodiments, the two patterns 103B and 103C is an active portion of the first redistribution layer 103, and the pattern 103A is a dummy portion of the first redistribution layer 103. In certain embodiments, the dummy portion 103A of the first redistribution layer 103 is not connected to any conductive path in all directions.

Referring to semiconductor packages 100 and 200 in FIG. 1, a molding compound 109 in package 100 encapsulates the first redistribution layer 103, the semiconductor die 105, and the adhesive layer 107. A molding compound 209 in package 200 encapsulates the semiconductor devices 205 and the electrical connections bridging the electronic signal between the semiconductor devices 205 in the package 200 and the semiconductor devices 105 in the package 100. In some embodiments, the conductive plugs 112 penetrate through the carrier 101 of the semiconductor package 100, connecting the first redistribution layer 103 at one end, and connecting contact pads of the semiconductor package 200 at the other end.

As shown in FIG. 1, the semiconductor structure 300 using a PoP technique has an electronic device 205 in package 200 and a semiconductor die 105 in package 100. In some embodiments, a footprint, or a projection area, of the electronic device 205 is greater than a footprint, or a projection area, of the semiconductor die 105. A conductive path between the semiconductor device 205 and first redistribution layer 103 extends from an active surface 205A of the electronic device 205 to a contact pad 201A positioned on a carrier 201 through bonding wires 211. The conductive path further penetrates the carrier 201 through a through carrier via 212, connecting to the conductive plug 112, and landing on a conductive stack composing of the seed layer 113 and the active portion (103B, 103C) of the first redistribution layer 103 in the semiconductor package 100. In some embodiments, the conductive plug 112 in the conductive path does not have to land on the conductive stack composing of the seed layer 113 and the active portion (103B, 103C) of the first redistribution layer 103. Instead, the conductive plug 112 lands on a seed layer 113 immediately connecting to a TPV 111. In other embodiments, the TPV 111 in package 100 is electrically connected to electronic components other than device 205 in the package 200.

Figure 2:
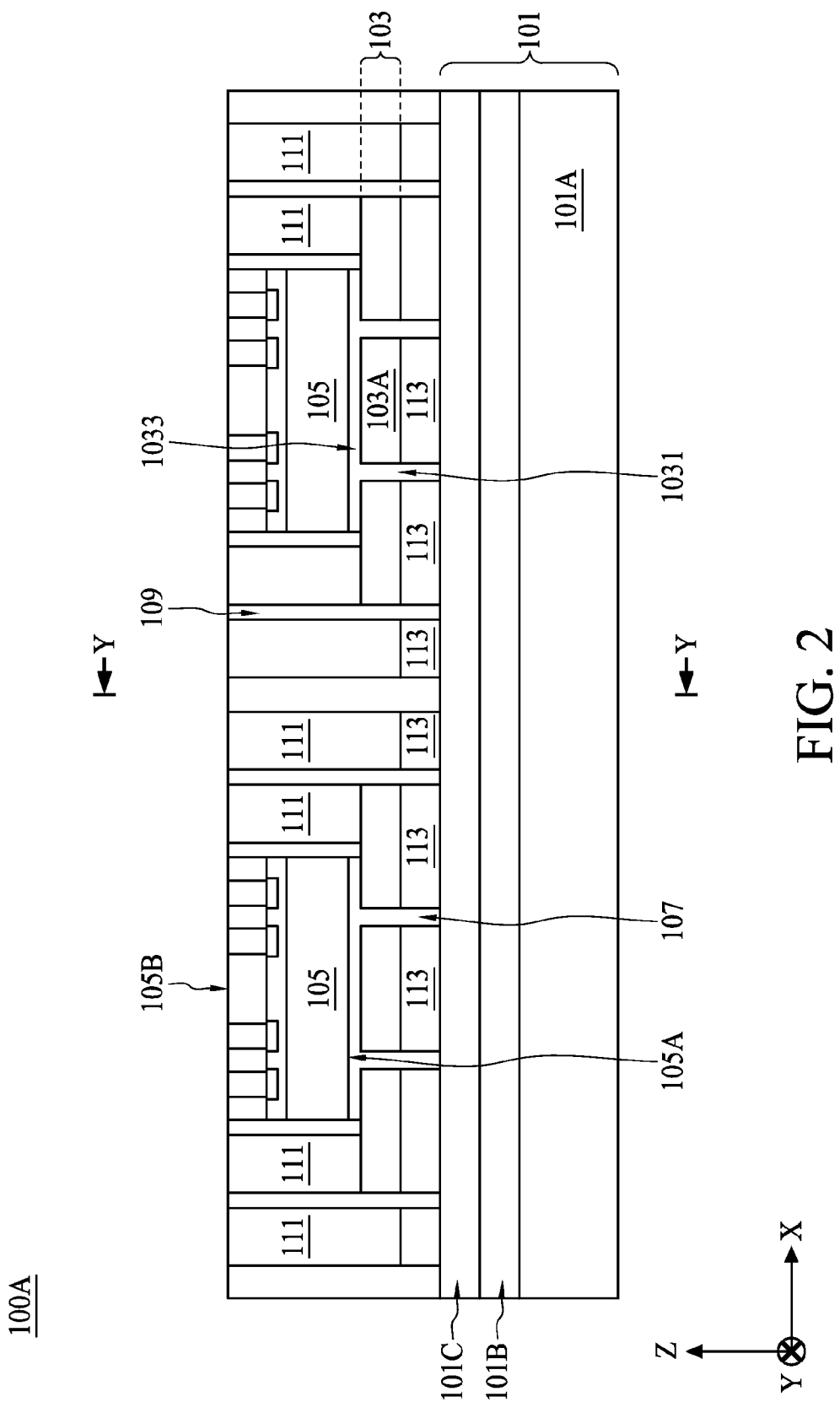
FIG. 2 is a cross sectional view of a semiconductor package according to some embodiments of the present disclosure.

FIG. 2 is a cross sectional view of a semiconductor structure according to some embodiments of the present disclosure. In some embodiments, the semiconductor structure is a semiconductor package 100A. Referring to FIG. 1 and FIG. 2, the semiconductor package 100A and the semiconductor package 100 are interchangeable. Elements with same labeling numbers as those in the semiconductor package 100 in FIG. 1 are previously discussed with reference thereto and are not repeated here for simplicity.

In FIG. 2, a semiconductor package 100A shows two semiconductor dies 105 prior to a wafer die sawing. Individual semiconductor dies are obtained when a die sawing machine separates the two dies through a line AA'. A dummy portion 103A of the first redistribution layer 103 is supporting a back side 105A of the semiconductor die 105. The dummy portion 103A of the first redistribution layer 103 is electrically isolated from other components in the package 100A because a top surface 1033 and a sidewall 1031 of the dummy portion 103A are in contact with an adhesive layer 107. In some embodiments, the adhesive layer is composed of insulating materials. A carrier 101 in the semiconductor package 100A includes a substrate 101A, a releasable layer 101B, and a gluing layer 101C. In some embodiments, the substrate 101A contains dummy or sacrificial base material such as silicon (Si), polymer, polymer composite, metal, ceramic, glass, glass epoxy, beryllium oxide, or other suitable low-cost, rigid material or bulk semiconductor material for structural support. In some embodiments, the releasable layer 101B contains material which decomposes by energy (including heat or light) irradiation. In some embodiments, the gluing layer contains a polymer-based layer such as a polybenzobisoxazole (PBO) film or an adhesive bonding film.

Figure 3:
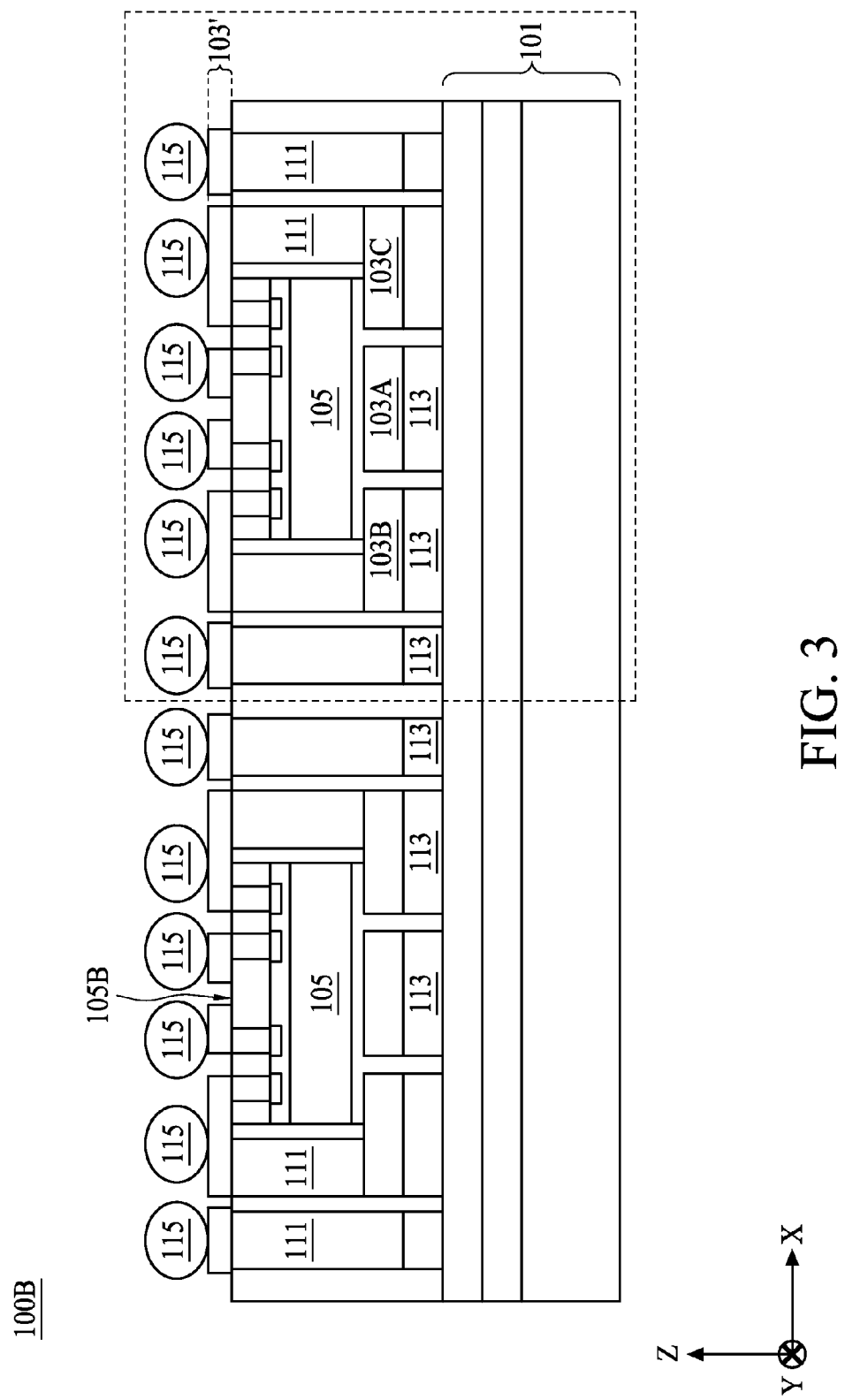
FIG. 3 is a cross sectional view of a semiconductor package according to some embodiments of the present disclosure.

FIG. 3 is a cross sectional view of a semiconductor structure according to some embodiments of the present disclosure. In some embodiments, the semiconductor structure is a semiconductor package 100B. Referring to FIG. 1 and FIG. 3, the semiconductor package 100B and the semiconductor package 100 are interchangeable. Referring to FIG. 1 and FIG. 3, the semiconductor package 100B and the semiconductor package 100 are interchangeable. Elements with same labeling numbers as those in the semiconductor package 100 in FIG. 1 are previously discussed with reference thereto and are not repeated here for simplicity.

In FIG. 3, a second redistribution layer 103' is positioned on a front side 105B of the semiconductor die 105. The active portion 103B and 103C of the first redistribution layer 103 is electrically connected to the second redistribution layer 103' through a through package via (TPV) 111. The TPV not landing on the first redistribution layer 103 connects to a seed layer 113 at one end and connects to the second redistribution layer 103' at the other end. As shown in FIG. 3, a first redistribution layer 103 is in proximity to a back side 105A of the semiconductor die 105. A second redistribution layer 103' is in proximity to a front side 105B of the semiconductor die 105.

In certain embodiments, a ball grid array containing several solder balls 115 is placed over the first redistribution layer 103'. The solder ball 115 includes eutectic Sn/Pb, high-lead solder, or lead-free solder. In certain embodiments, under bump metallization (UBM) (not shown) is positioned in the second redistribution layer 103', receiving the solder balls 115. UBM contains multiple layers of selectively plated Ni/Au, titanium (Ti)/Cu, titanium tungsten (TiW)/Cu, Ti/Cu/nickel vanadium (NiV)/Cu, or the combination thereof. In addition to the solder ball, other interconnect structure is used in other embodiments. For example, stud bump or micro bump. In certain embodiments, UBM provide bondable pads for bonding with various bumps, and further provide a barrier to metal diffusion.

Figure 4:
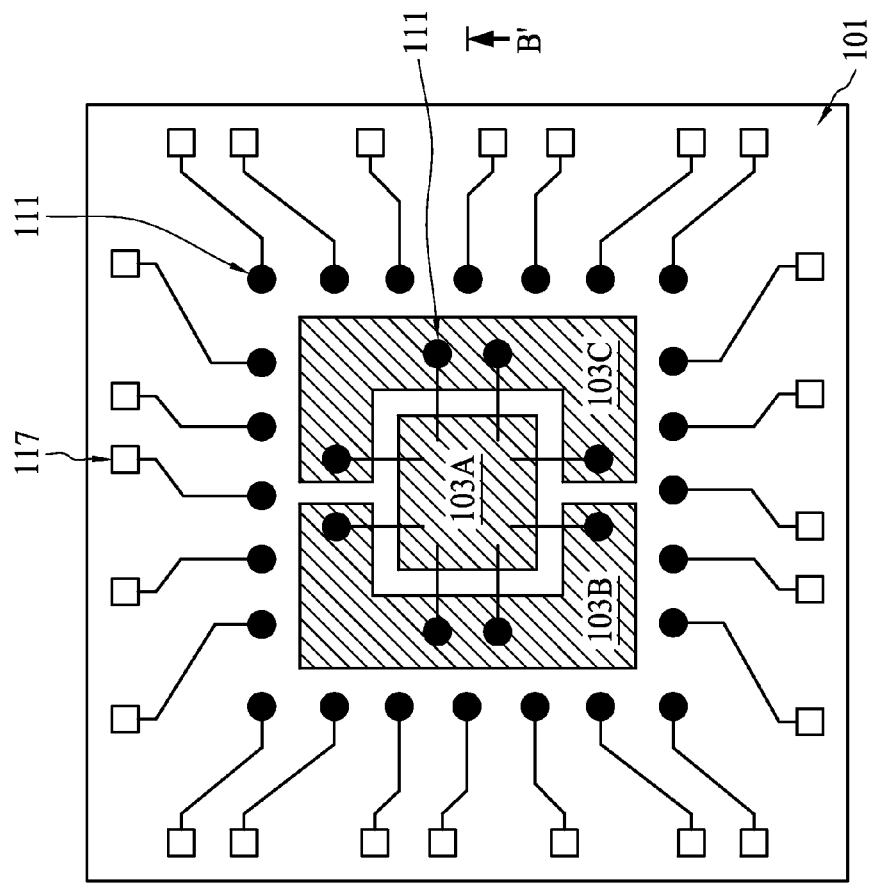
FIG. 4 is a top view of a portion of a semiconductor package according to some embodiments of the present disclosure.

FIG. 4 is a top view of a semiconductor structure according to some embodiments of the present disclosure. Referring to the Cartesian coordinate in FIGS. 2-3 and FIG. 4, the top view in FIG. 4 shows an X-Y plane of the semiconductor structures 100A and 100B in FIG. 2 and FIG. 3, respectively. In some embodiments, FIG. 4 is a top view of a right portion (framed in dotted lines) of the semiconductor package 100B in FIG. 3. In other is words, the right portion of the semiconductor package 100B in FIG. 3 is a cross section sectioning along line BB' in FIG. 4. For clarity purpose, the semiconductor die 105 and the second redistribution layer 103' are not shown in FIG. 4. In some embodiments, the dummy portion 103A of the first redistribution layer 103 is positioned in the middle of the semiconductor package 100B. In certain embodiments, the active portion 103B and 103C of the first redistribution layer 103 surrounds the dummy portion 103A. Several TPVs 111 are arranged on the active portion 103B and 103C. In addition, more TPVs 111 are situated at positions without the first redistribution layer 103.

Referring to FIG. 4, in some embodiments, the TPVs 111 on the active portion 103B and 103C of the first redistribution layer 103 extend the conductive trace back to a semiconductor die (not shown) positioned over the dummy portion 103A. In other embodiments, the TPVs 111 on the active portion 103B and 103C of the first redistribution layer 103 extend to other directions connecting to devices other than the semiconductor die 105 (not shown in FIG. 4). In certain embodiments, TPVs 111 situated on positions without the first redistribution layer 103 are in direct contact with the seed layer 113 shown in FIG. 3. In some embodiments, TPVs 111 landing on the seed layer 113 extend outwards to connect with external contacts 117. However, in certain embodiments, the TPVs 111 landing on the seed layer 113 connects back to the contact pads on a front surface 105B of the semiconductor die 105 (not shown in FIG. 4).

Referring to FIG. 3, FIG. 4, and FIG. 5A to FIG. 5D, wherein FIG. 5A to FIG. 5D are top views of a semiconductor package according to some embodiments of the present disclosure. Compared to FIG. 4, FIG. 5A to FIG. 5D show only a footprint area A1 of the dummy portion 103A in the first redistribution layer 103 and a footprint area A2 of the semiconductor die 105 positioned on the first redistribution layer 103, whereas FIG. 4 shows a top profile of the TPV 111 and conductive traces. In some embodiments, the footprint area A1 is a projection area of the dummy portion 103A, and the footprint area A2 is a projection area of the semiconductor die 105. When observing a top view from a front side of a semiconductor die 105, the footprint area A1 of the dummy portion 103A is under the footprint area A2 of the semiconductor die 105 and thus the view of the dummy portion 103A shall be blocked. For clarity purpose, the footprint area A1 of the dummy portion 103A is shown in FIGS. 5A to 5D in order to compare sizes of the area A1 and area A2.

In some embodiments, the dummy area 103A is visible by an X-ray scanning. In other embodiments, the dummy area 103 is shown by removing the semiconductor die 105 and the adhesive layer 107 covering above and around the dummy area 103.

In FIG. 5A to FIG. 5D, the footprint area A2 of the semiconductor die 105 is greater than the footprint area A1 of the dummy portion 103A. In some embodiments, the footprint area ratio A1/A2 is within a range of from about 0.3 to about 0.8. For example, in FIG. 5A to FIG. 5D, the footprint area ratio A1/A2 is about 0.75, 0.3, 0.45, and 0.5, respectively. In some embodiments, the dummy portion 103A includes several patterns. For example, the dummy portion shown in FIG. 5B contains four squares. In other embodiments, the dummy portion 103A includes polygonal shapes such as tetragonal shape or triangle. In certain embodiments, the dummy portion 103A includes irregular shapes mixing curved and straight boundaries.

Figure 5B:
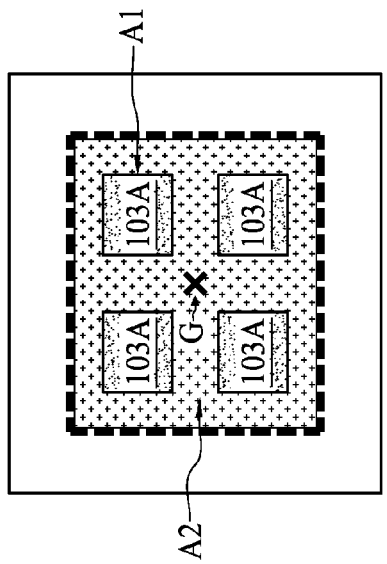
FIG. 5A to FIG. 5D are top views of a semiconductor package according to some embodiments of the present disclosure.
Figure 5D:
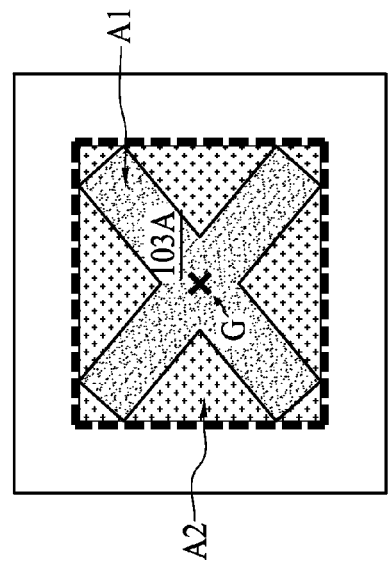
Figure 5A:
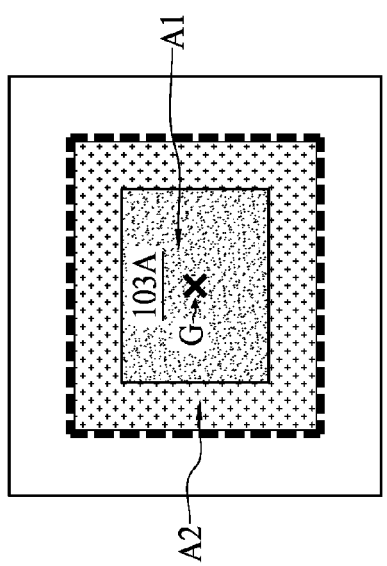
Figure 5C:
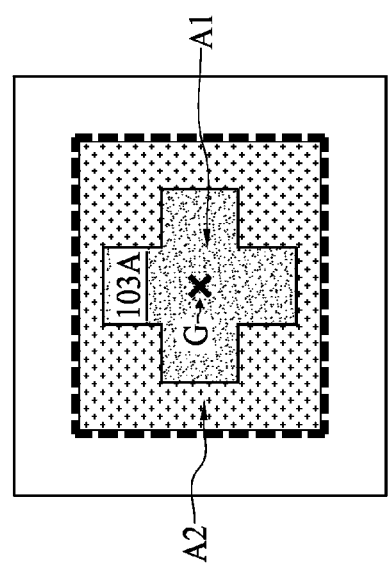

Referring to FIG. 5A to 5D, in some embodiments, the dummy portion 103A is symmetric to a geometric center G. For example, in FIG. 5C, the dummy portion 103A is a cross shape with a geometric center G. The cross shape at least has a four fold symmetry with respect to the geometric center G. In FIG. 5B, even the dummy portion 103A is not a single continuous area, a geometric center G is identified taking the four squares into account. Similarly, the four square arrangement has at least a four fold symmetry with respect to the geometric center G.

Referring to FIG. 3, FIG. 4, and FIG. 6A to FIG. 6D, wherein FIG. 6A to FIG. 6D are top views of a semiconductor package according to some embodiments of the present disclosure. Compared to FIG. 4, FIG. 6A to FIG. 6D show only a footprint area A1 of the dummy portion 103A in the first redistribution layer 103 and a footprint area A2 of the semiconductor die 105 positioned on the first redistribution layer 103, whereas FIG. 4 shows a top profile of the TPV and the conductive traces. In some embodiments, the footprint area A1 is a projection area of the dummy portion 103A, and the footprint area A2 is a projection area of the semiconductor die 105. When observing a top view from a front side of a semiconductor die 105, the footprint area A1 of the dummy portion 103A is under the footprint area A2 of the semiconductor die 105 and thus the view of the dummy portion 103A shall be blocked. For clarity purpose, the footprint area A1 of the dummy portion 103A is shown in FIGS. 6A to 6D in order to compare sizes of the footprint area A1 and the footprint area A2.

Figure 6A:
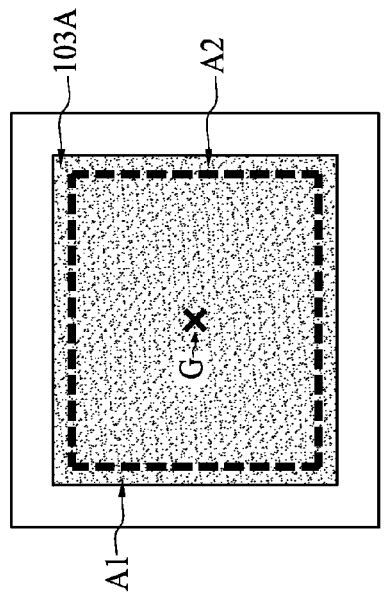
FIG. 6A to FIG. 6D are top views of a semiconductor package according to some embodiments of the present disclosure.
Figure 6B:
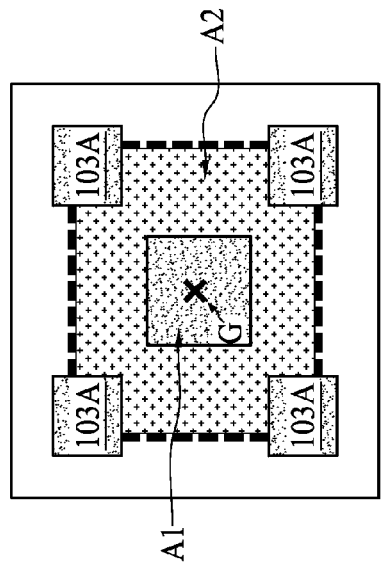
Figure 6C:
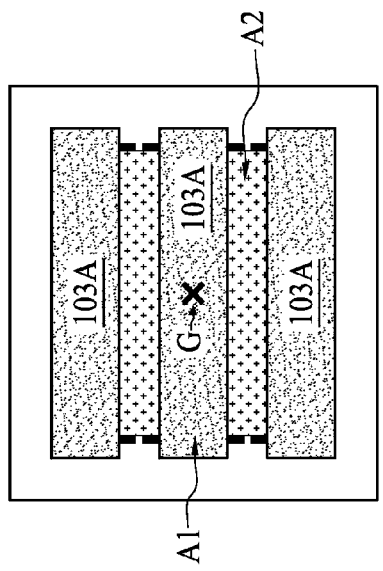

In FIG. 6A to 6D, a portion of the patterns of the dummy portion 103A is situated outside the footprint area A2 of the semiconductor die 105. In some embodiments as shown in FIG. 6A, a part of the dummy portion 103A is situated outside the footprint area A2 of the semiconductor die 105, and the footprint area ratio A1/A2 is greater than unity. Thus, only a footprint area A1 of the dummy portion 103A is shown in FIG. 6A because the footprint area A2 of the semiconductor die 105 is completely covered by the footprint area A1, and only a dotted line is delineated showing the boundary of the footprint area A2. In other embodiments as shown in FIG. 6B, a part of the dummy portion 103A is situated outside the footprint area A2 of the semiconductor die 105, but the footprint area ratio A1/A2 is below unity. In some embodiments, the footprint area ratio A1/A2 is within a range of from about 0.5 to about 1.2. For example, in FIG. 6A to FIG. 6D, the footprint area ratio A1/A2 is about 1.2, 0.0.5, 0.8, and 0.6, respectively.

Figure 6D:
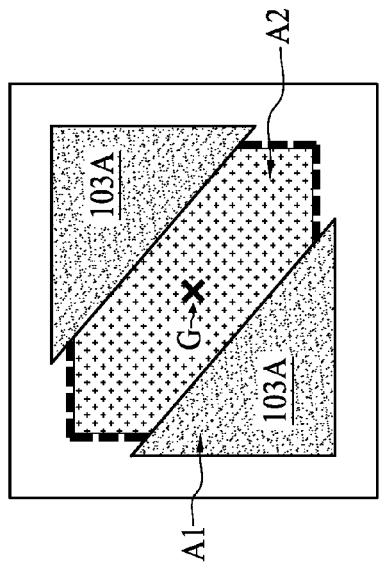

Referring to FIG. 6A to 6D, in some embodiments, the dummy portion 103A includes several patterns. For example, the dummy portion shown in FIG. 6B contains five squares. In other embodiments, the dummy portion 103A includes polygonal shapes such as tetragonal shape or triangle. In certain embodiments, the dummy portion 103A includes irregular shapes mixing curved and straight boundaries. In some embodiments, the dummy portion 103A is symmetric to a geometric center G. For example, in FIG. 6C, the dummy portion 103A is a cross shape with a geometric center G. The cross shape at least has a two fold symmetry with respect to the geometric center G. In FIG. 6D, even the dummy portion 103A contains two opposite triangles, a geometric center G is identified taking the two opposite triangles into account. Similarly, the two-triangle arrangement has at least a two-fold symmetry with respect to the geometric center G.

Figure 7B:
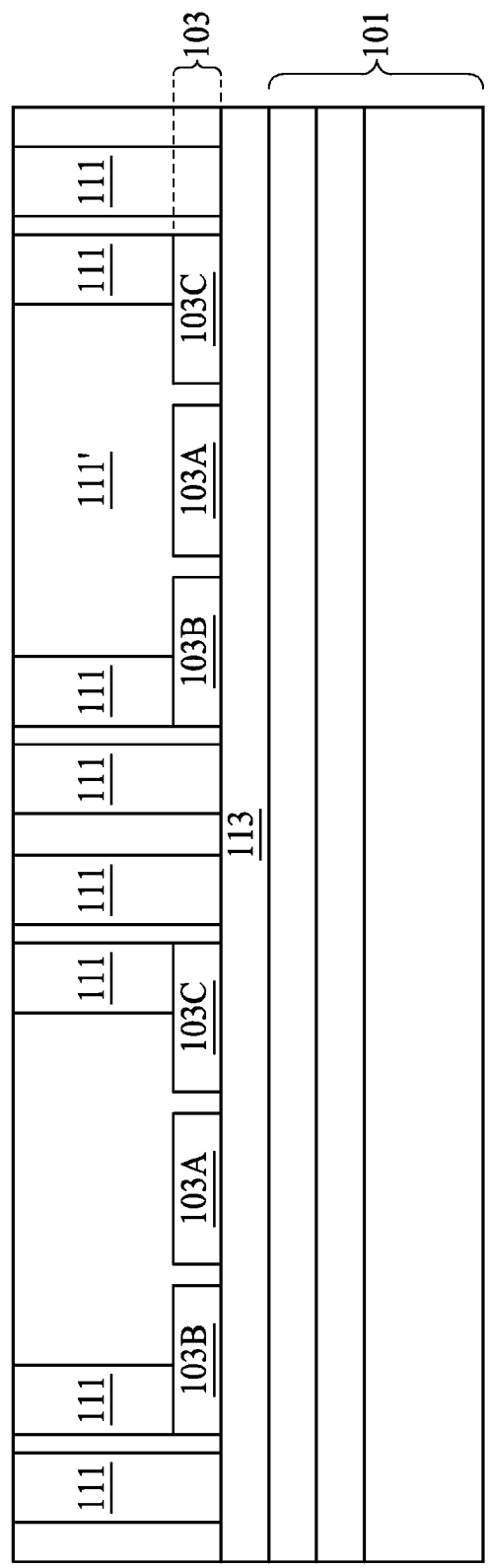

FIG. 7A to FIG. 7K are various operation in a method for manufacturing a semiconductor structure in the present disclosure. In FIG. 7A, a first redistribution layer 103 is patterned on a carrier 101. In some embodiments, the patterning operation is conducted by photolithography. Photolithography includes forming a pattern in reticles or a photomask (not shown) and transferring the pattern into a surface layer of the carrier 101. In other embodiments, the patterning operation includes patterning materials by directly depositing the material into the areas or voids formed by a previous deposition/etch operation using techniques such as electroless and electrolytic plating. In certain embodiments, the first redistribution layer 103 is formed over a surface of the carrier 101 using evaporation, electrolytic plating, electroless plating, screen printing, or other suitable metal deposition process. The first redistribution layer 103 provides for electrical communication between each of the semiconductor packages, mounted components, and other external system components. The first redistribution layer 103 also provides power and ground connections to each of the semiconductor packages.

As shown in FIG. 7A, the carrier 101 contains a substrate 101A and a multilayer (101B, 101C, 101D) stack positioned on the substrate 101A. In some embodiments, the multilayer stack includes a releasable layer 101B, a gluing layer 101C, and a seed layer 113. The releasable layer 101B contains material which decomposes by energy (including heat or light) irradiation. The gluing layer contains a polymer-based layer such as a polybenzobisoxazole (PBO) film or an adhesive bonding film. In certain embodiments, the gluing layer is formed by a spin coating operation. In certain embodiments, the seed layer 113 contains multiple layers of selectively plated Ni/Au, titanium (Ti)/Cu, titanium tungsten (TiW)/Cu, Ti/Cu/nickel vanadium (NiV)/Cu, or their combination, and is formed by PVD, CVD, sputtering, electrolytic plating, electroless plating, metal evaporation, metal sputtering, or other suitable metal deposition process. In certain embodiments, the seed layer 113 has a thickness of from about 50 nm to about 100 nm.

Referring to FIG. 7B, several through package vias (TPVs) are formed over the first redistribution layer 103. In some embodiments, the formation of the TPVs includes filling conductive materials in the voids previously formed in a hard mask or a photoresist layer 111' through PVD, CVD, sputtering, electrolytic plating, electroless plating, metal evaporation, or a metal sputtering operation. Forming the TPVs at predetermined region defines an active portion (103B, 103C) and a dummy portion 103A in the first redistribution layer 103. For example, The active portion (103B, 103C) includes at least one TPV landing on a top surface of that specific pattern of the first redistribution layer 103, and the TPV connects the electrical signal from the active portion (103B, 103C) to other signal-receiving components in the semiconductor package. On the other hand, the dummy portion 103A is not contacting to any TPVs, but is electrically coupled to other patterns in the first redistribution layer 103 through the underlying seed layer 113. As shown in FIG. 7B, some TPVs are formed on a surface of the carrier 101 instead of on the active portion (103B, 103C) of the first redistribution layer 103.

Figure 7C:
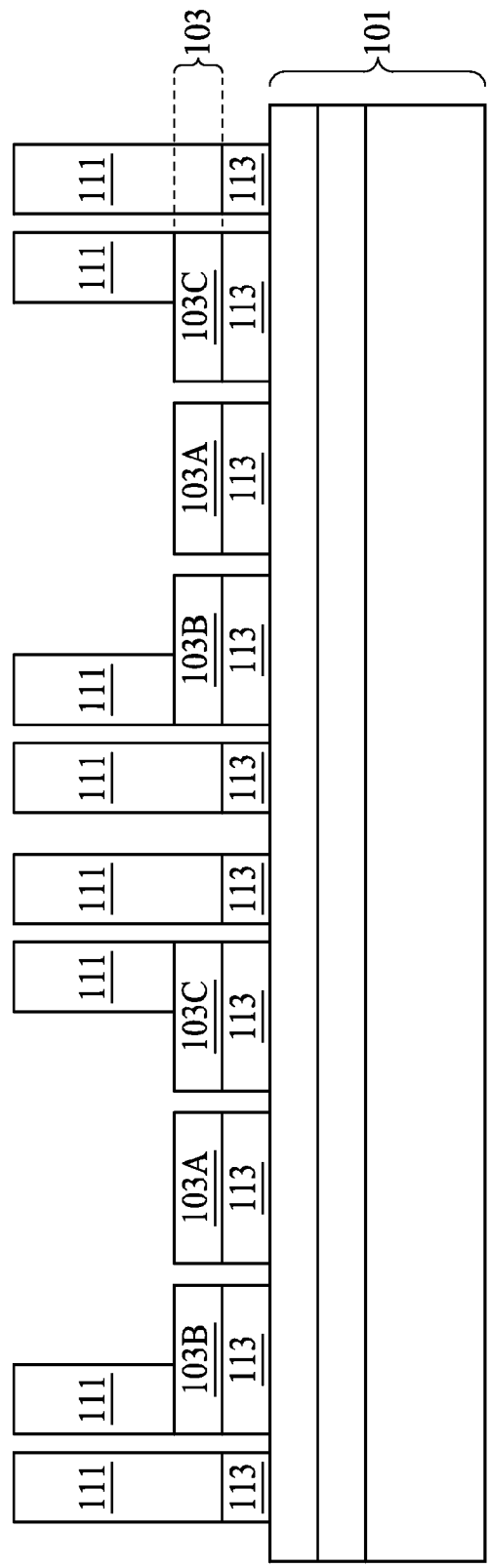

FIG. 7C shows a removal of the hard mask or the photoresist layer 111' after the formation of the TPVs, and followed by an etch separating the seed layer 113 under each pattern (103A, 103B, 103C) of the first redistribution layer 103. The dummy portion 103A is neither contacting to any TPVs nor connecting to other patterns (103B, 103C) in the first redistribution layer 103. In other words, the dummy potion 103A is electrically isolated from other components in the semiconductor package.

Figure 7D:
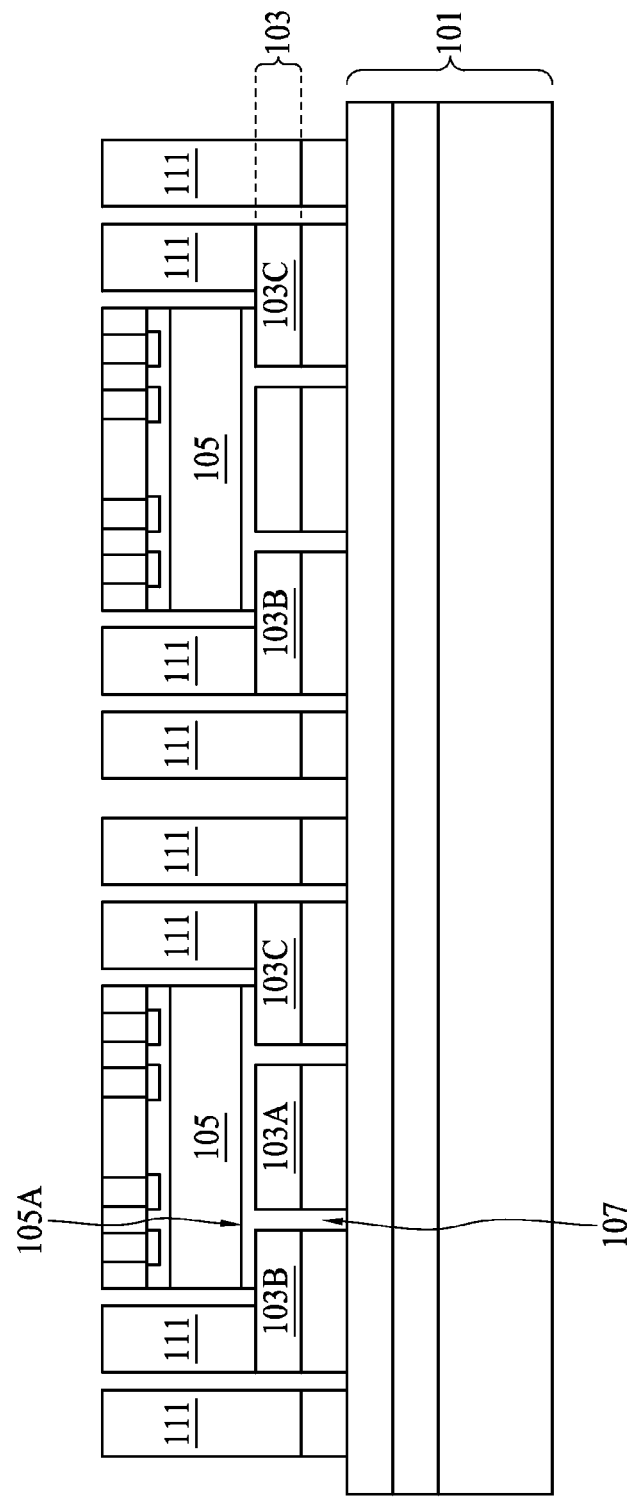

Referring to FIG. 7D, two semiconductor dies 105 are placed on the first redistribution layer 103. In some embodiments, placing the semiconductor die 105 includes applying a die attached film (DAF) 107 on a back side 105A of the semiconductor die 105, and followed by an annealing operation to soften the DAF 107, allowing the DAF 107 to fill a gap between adjacent patterns of the first redistribution layer 103. In some embodiments, the annealing operation is omitted. Note that the semiconductor die 105 is placed at least over the dummy portion 103A. In some embodiments, a footprint of the semiconductor die 105 covers the dummy portion 103A and a part of the active portion (103B, 103C). In other embodiments, a footprint of the semiconductor die 105 covers only a part of the dummy portion 103A. The footprint area ratio between the semiconductor dies 105 and the dummy portion 103A are previously discussed with reference to FIG. 5A to FIG. 6D of the present disclosure and are not repeated here for simplicity. Because the back side 105A of the semiconductor die 105 is facing the dummy portion 103A of the first redistribution layer 103, in some embodiments, the first redistribution layer 103 is called a back-side redistribution layer.

Figure 7E:
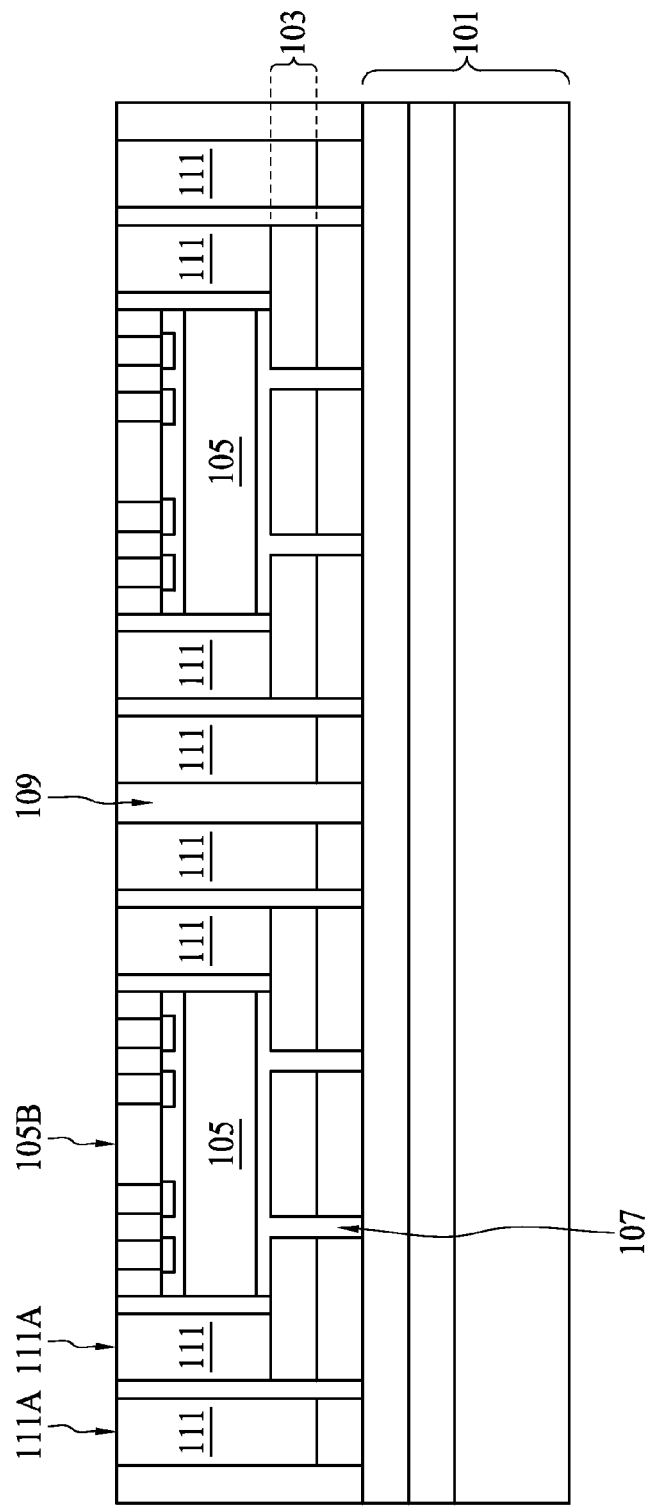

In FIG. 7E, a molding compound 109 is applied to the semiconductor package to encapsulate the first redistribution layer 103, the semiconductor dies 105, and the adhesive is layer 107. In some embodiments, a planarization operation is conducted after the encapsulation to remove excess material over the semiconductor die 105 and a top surface 111a of the TPVs from a front side 105B. The planarization operation involves polishing the surface of the semiconductor package with a polishing pad. An abrasive material and corrosive chemical are added to the surface of the wafer during polishing. The combined mechanical action of the abrasive and corrosive action of the chemical removes any irregular topography, resulting in a uniformly flat surface.

Figure 7F:
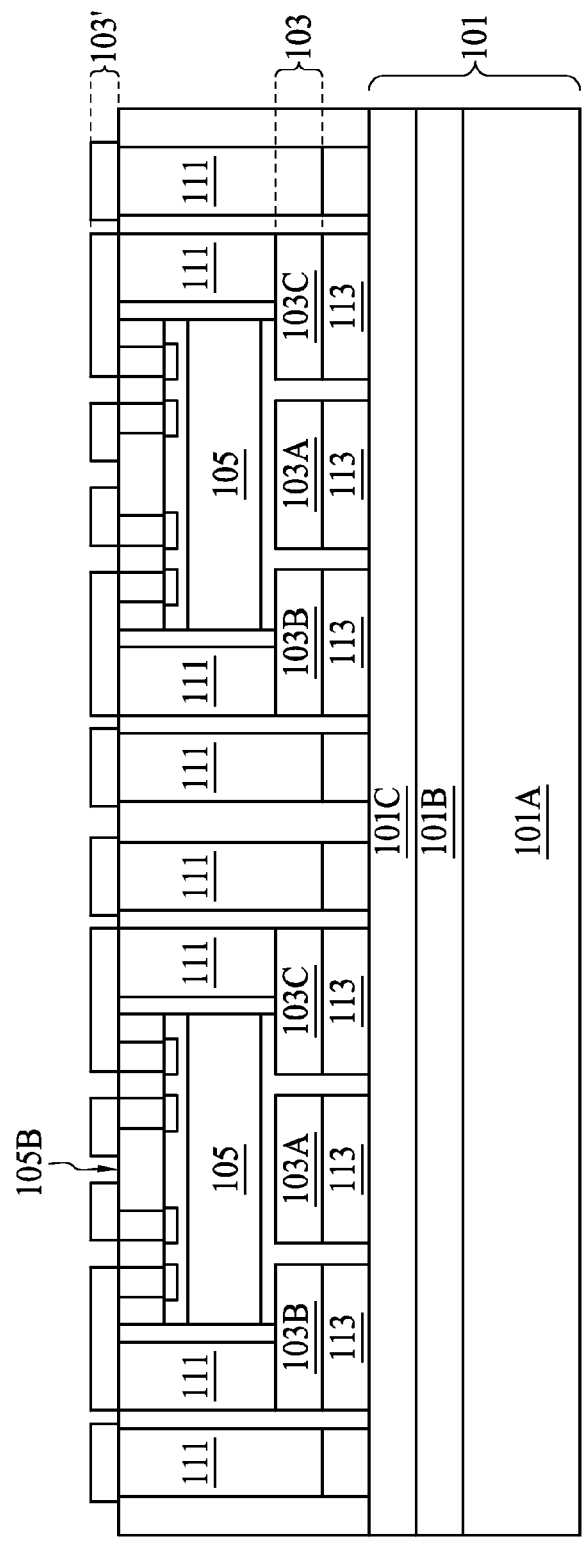

FIG. 7F shows a second redistribution layer 103' is formed on the front side 105B of the semiconductor die 105. In some embodiments, a patterning operation is utilized to form the conductive traces in the second redistribution layer 103'. As shown in FIG. 7F, a conductive path starting from the seed layer 113 and the active portion (103B, 103C) of the first redistribution layer 103 is connected to the second redistribution layer 103' through a TPV 111. Another conductive path is formed starting from the seed layer 113 to the first redistribution layer 103' through another TPV 111. Note none of the conductive path is formed from the dummy portion 103A of the first redistribution layer 103 to the second redistribution layer 103'.

Figure 7G:
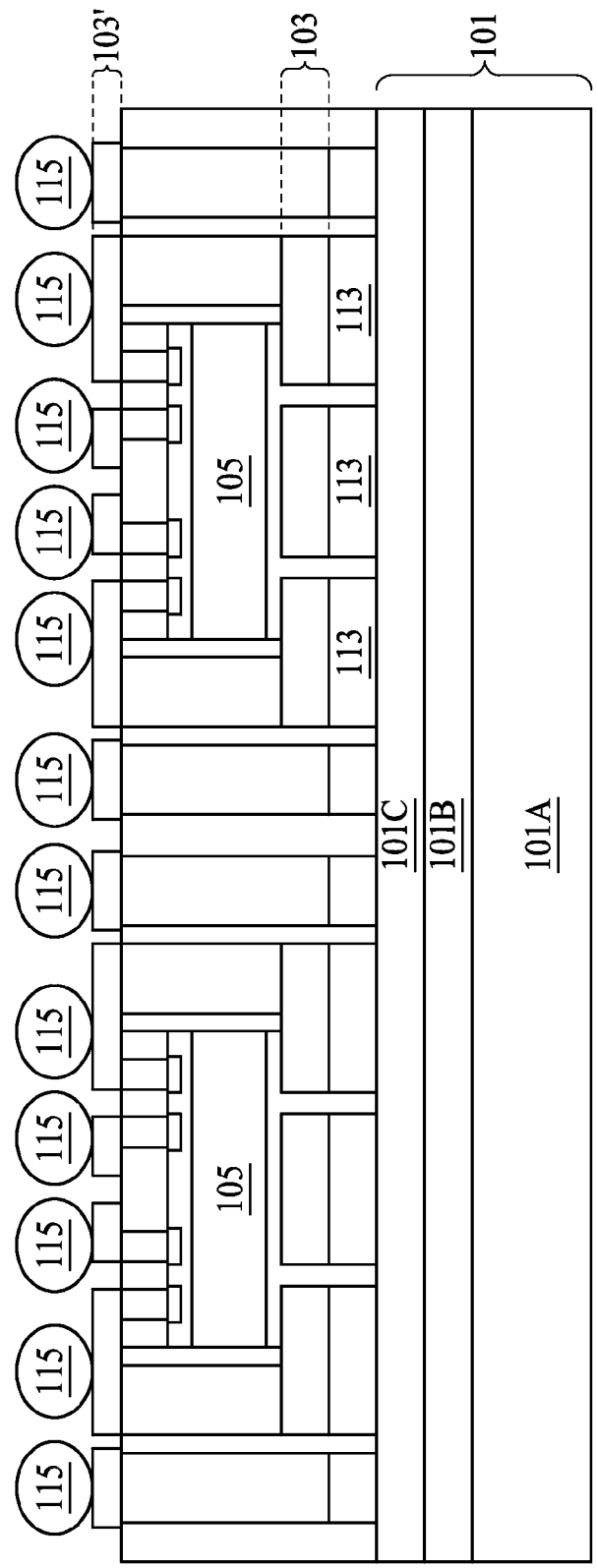
Figure 7H:
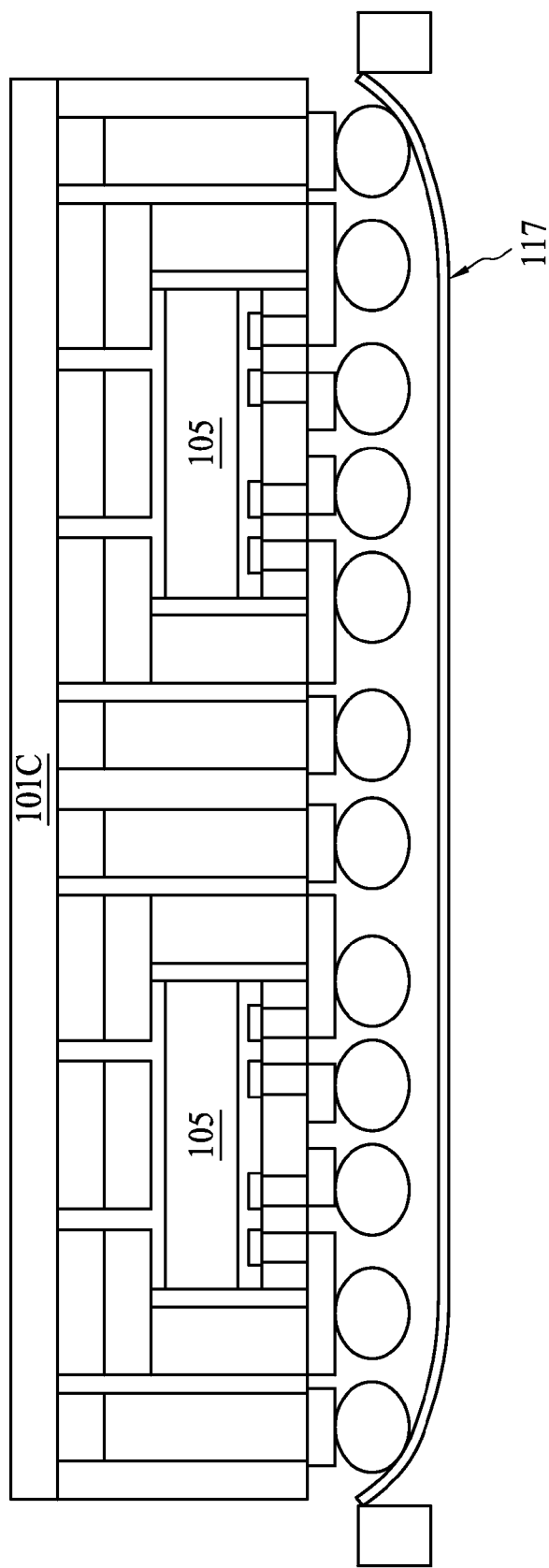

FIG. 7G to FIG. 7K is a series of operation to complete individual semiconductor packages. In FIG. 7G, a ball grid array (BGA) is formed on the second redistribution layer 103'. In some embodiments, the BGA is formed by a ball dropping, a screen printing, or a stencil printing operation. In FIG. 7H, the substrate layer 101A of the carrier 101 is de-bonded by light irradiation or heat. In some embodiments, the releasable layer 101B is configured to degrade and generating defects and voids under the irradiation of UV light or laser. When the degradation reaches a certain point, a portion of the semiconductor package over the gluing layer 101C are detached from the substrate layer 101A. The detached semiconductor package is then inverted and a side having the BGA 115 is placed on a blue tape 117. In some embodiments, several layers of tapes are laminated on the gluing layer 101C for protection and warpage balance. The protecting tape includes solder resist, laminating compound, or adhesive bonding film. In other embodiments, lamination of the protecting tape is omitted.

Figure 7I:
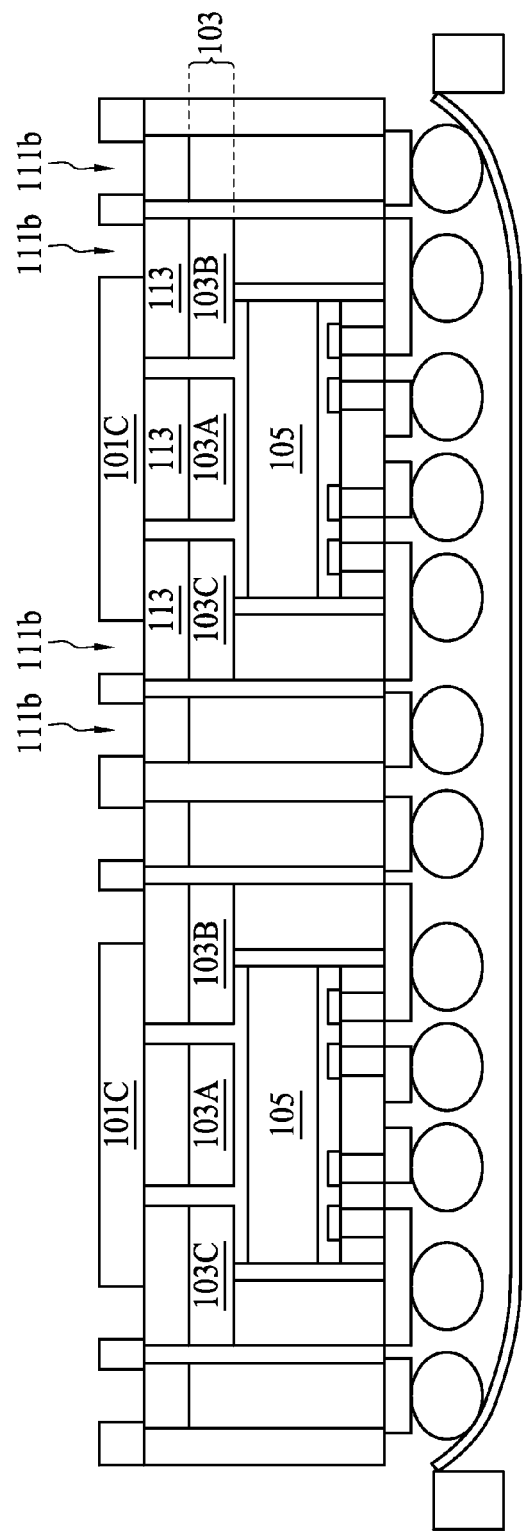
Figure 7J:
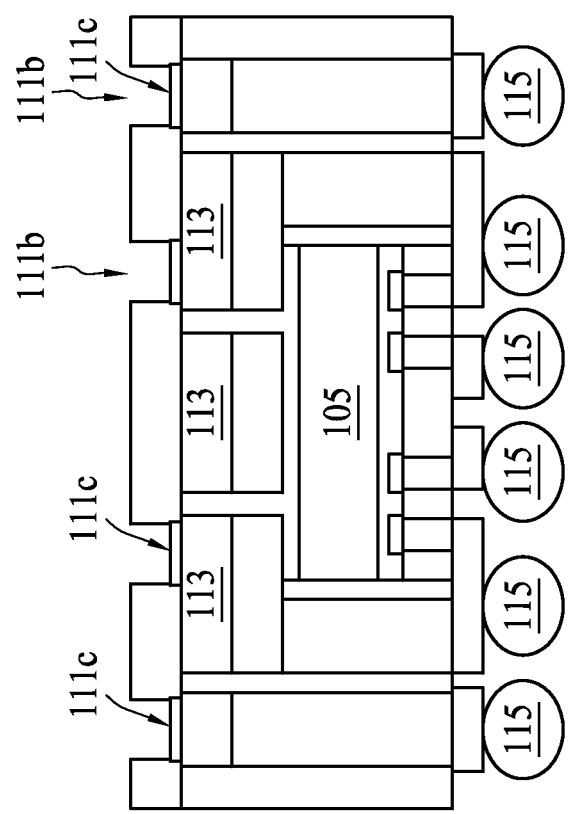

FIG. 7I shows a drilling operation opening holes 111b at predetermined positions for electrical conduction. In some embodiments, the drilling operation includes a laser drill, followed by a post-drill cleaning to remove the residue during the operation. In some embodiments, the holes 111b are opened in the gluing layer 101C, on the active portion (103B, 103C) of the first redistribution layer 103. In other embodiments, the holes 111b are opened in the gluing layer 101C, over a TPV 111 without contacting to a first redistribution layer 103. FIG. 7J shows a result of semiconductor die 105 singulation. In some embodiments, the semiconductor package shown in FIG. 7I is scored and broken along non-functional regions of the package called saw streets or scribes. The package is singulated using a laser cutting tool or saw blade. In some embodiments, only one semiconductor die 105 is encapsulated in a singulated package. In other embodiments, more than one semiconductor die 105 is encapsulated in a singulated package. As shown in FIG. 7J, in some embodiments, an organic surface protection (OSP) is applied to a bottom 111c of the hole 111b. OSP is an organic solution based on an imidazole substitute which, by means of dipping or rinsing can be selectively applied to a metal surface, ready for soldering. A thin transparent OSP layer covers a surface of the exposed seed layer 113 like a barely visible clear varnish.

Figure 7K:
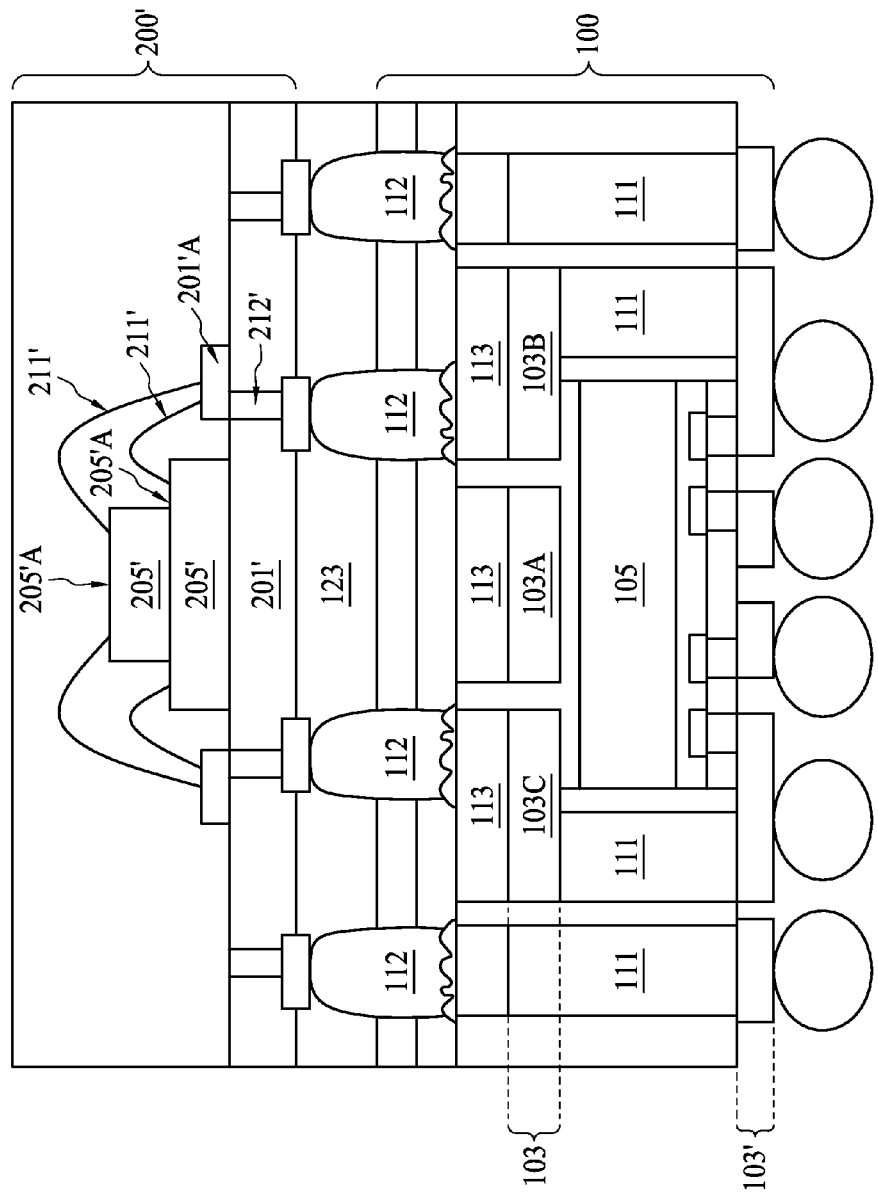

Referring to FIG. 7K, the singulated package shown in FIG. 7J is electrically connected to another semiconductor package 200' through several conductive plugs 112. Note the semiconductor package 200' differs from the semiconductor package 200 shown in FIG. 1 in that the semiconductor device 205' encapsulated in the package 200' has a smaller footprint than the footprint of the semiconductor die 105 in the semiconductor package 100. Under such condition, a conductive path between the semiconductor device 205' and first redistribution layer 103 extends from an active surface 205'A of the electronic device 205' to a contact pad 201'A positioned on a carrier 201' through bonding wires 211'. The conductive path further penetrates the carrier 201' through a through carrier via 212', connecting to the conductive plug 112, and landing on a conductive stack composing of the seed layer 113 and the active portion (103B, 103C) of the first redistribution layer 103 in the semiconductor package 100. The conductive stack extends out from the footprint of the semiconductor die 105 and electrically connected to a second redistribution layer 103' by TPVs 111. In some embodiments, an additional underfill 123 is introduced between the semiconductor packages 200' and 100, in order to provide additional mechanical support to the conductive plug 112 in a mobile device.

In some embodiments, a semiconductor structure in a present disclosure includes a carrier, a first redistribution layer (RDL) over the carrier, a semiconductor chip over the RDL, an adhesive layer between the semiconductor chip and the RDL, and a molding compound encapsulating the first RDL, the semiconductor chip, and the adhesive layer. The first RDL includes at least one pattern electrically isolated from any component of the semiconductor structure.

In certain embodiments, the first RDL is electrically connected to a semiconductor package. In certain embodiments, a back side of the semiconductor chip is in proximity to the first RDL. In certain embodiments, the semiconductor structure further includes a second RDL positioned on a front side of the semiconductor chip.

In some embodiments, a package-on-package (PoP) semiconductor structure provided in the present disclosure includes a carrier, a redistribution layer (RDL) comprising an active portion and a dummy portion attaching to the carrier, and a semiconductor chip attaching to the RDL by an adhesive layer. A portion of the semiconductor chip attaches to the dummy portion of the RDL and the RDL is electrically coupled to a semiconductor package via a conductive plug passing through the carrier.

In certain embodiments, a portion of the dummy portion of the RDL is positioned outside a projection area of the semiconductor chip. In other embodiments, a projection area of the semiconductor chip is greater than a projection area of the dummy portion of the RDL.

In certain embodiments, an area ratio of the projection area of the dummy portion of the RDL and the projection area of the semiconductor chip is less than 1.2. In certain embodiments, the RDL is in contact to a back side of the semiconductor chip.

In some embodiments, a method of manufacturing a semiconductor structure as discussed in the present disclosure is provided. The method includes forming a redistribution layer (RDL) on a carrier, defining an active portion and a dummy portion of the RDL, and placing a semiconductor chip at least over the dummy portion of the RDL.

In certain embodiments, the operation of defining an active portion and a dummy portion of the RDL includes plating a through package via (TPV) on the active portion of the RDL.

In certain embodiments, the operation of placing a semiconductor chip at least over the dummy portion of the RDL includes facing a back side of the semiconductor chip to the dummy portion of the RDL.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a first redistribution layer (RDL), comprising at least one pattern electrically isolated from any component of the semiconductor structure;
   a semiconductor die over the first RDL, at least one contact pad being positioned on a front side of the semiconductor die;
   an adhesive layer between a back side of the semiconductor die and the first RDL, the back side is opposite to the front side; and
   a molding compound, encapsulating the first RDL, the semiconductor die, and the adhesive layer, and
   a through package via (TPV) penetrating the molding compound and electrically connecting the front side and the first RDL.

2. The semiconductor structure in claim 1, wherein the TPV is electrically connected to a semiconductor package.

3. The semiconductor structure in claim 1, wherein the first RDL is electrically connected to a semiconductor package.

4. The semiconductor structure in claim 3, wherein the semiconductor package comprises a DRAM package, a processor package, or a flash memory package.

5. The semiconductor structure in claim 1, the back side of the semiconductor die is in proximity to the at least one pattern electrically isolated from any component of the semiconductor structure of the first RDL.

6. The semiconductor structure in claim 1, further comprising a second RDL on the front side of the semiconductor die.

7. The semiconductor structure in claim 1, a sidewall and a top surface of the at least one pattern of the first RDL is surrounded by the adhesive layer.

8. A package-on-package (PoP) semiconductor structure, comprising:
   a polymer-based layer; a redistribution layer (RDL) comprising an active portion and a dummy portion attaching to a first side of the polymer-based layer; and
   a semiconductor die attaching to the RDL by an adhesive layer,
   wherein a portion of the semiconductor die is attaching to the dummy portion of the RDL, and wherein the RDL is electrically coupled to a semiconductor package at a second side of the polymer-based layer via a conductive plug passing through the polymer-based layer, and wherein the second side is opposite to the first side.

9. The PoP semiconductor structure in claim 8, wherein a portion of the dummy portion of the RDL is positioned outside a projection area of the semiconductor die.

10. The PoP semiconductor structure in claim 8, an area ratio of a projection area of the dummy portion of the RDL and a projection area of the semiconductor die is less than 1.2.

11. The PoP semiconductor structure in claim 8, a projection area of the semiconductor die is greater than a projection area of the dummy portion of the RDL.

12. The PoP semiconductor structure in claim 8, wherein the dummy portion of the RDL comprises a plurality of patterns.

13. The PoP semiconductor structure in claim 8, an arrangement of the dummy portion of the RDL is symmetric to a geometric center of the semiconductor die.

14. The PoP semiconductor structure in claim 8, wherein the dummy portion of the RDL comprises a polygonal shape.

15. The PoP semiconductor structure in claim 8, wherein the RDL is in contact to a back side of the semiconductor die.

16. The PoP semiconductor structure in claim 8, wherein a dummy portion of the RDL is surrounded by the adhesive layer.

17. A semiconductor structure, comprising:
- a polymer-based layer;
- a first redistribution layer (RDL) over the polymer-based layer, the first RDL comprising a dummy portion attached to a first side of the polymer-based layer;
- a semiconductor die at least partially over the dummy portion; and
- a second RDL over a front side of the semiconductor die, the front side having at least one contact pad;
- wherein a projection area of the dummy portion is smaller than a projection area of the semiconductor die.

18. The semiconductor structure in claim 17, wherein the first RDL is in contact to a back side of the semiconductor die, the back side being opposite to the front side.

19. The semiconductor structure in claim 17, wherein the first RDL further comprises an active portion electrically coupling to a semiconductor package at a second side of the polymer-based layer via a conductive plug passing through the polymer-based layer, wherein the first side is opposite to the second side.

* * * * *